US010366184B1

(12) United States Patent
Kim et al.

(10) Patent No.: US 10,366,184 B1
(45) Date of Patent: Jul. 30, 2019

(54) STABLE NEO-HOOKEAN FLESH SIMULATION

(71) Applicant: Pixar, Emeryville, CA (US)

(72) Inventors: Theodore W. Kim, Oakland, CA (US); Fernando Ferrari De Goes, Berkeley, CA (US); Breannan D. Smith, Oakland, CA (US)

(73) Assignee: Pixar, Emeryville, CA (US)

( * ) Notice: Subject to any disclaimer, the term of this patent is extended or adjusted under 35 U.S.C. 154(b) by 0 days.

(21) Appl. No.: 15/941,928

(22) Filed: Mar. 30, 2018

(51) Int. Cl.
*G06T 17/20* (2006.01)
*G06F 17/50* (2006.01)
*G06T 15/08* (2011.01)

(52) U.S. Cl.
CPC .......... *G06F 17/5009* (2013.01); *G06T 15/08* (2013.01); *G06T 17/20* (2013.01)

(58) Field of Classification Search
None
See application file for complete search history.

(56) References Cited

U.S. PATENT DOCUMENTS

| 8,102,403 B1* | 1/2012 | DeRose | G06T 13/40 345/419 |
| 2004/0174360 A1* | 9/2004 | Deering | G06T 15/60 345/426 |

OTHER PUBLICATIONS

Teschner et al. A Versatile and Robust Model for Geometrically Complex Deformable Solids, Dec. 2004, 1-8 (Year: 2004).*

(Continued)

*Primary Examiner* — Robert J Craddock
(74) *Attorney, Agent, or Firm* — Patterson + Sheridan, LLP

(57) ABSTRACT

Systems, methods and articles of manufacture for rendering images depicting materials are disclosed. A stable Neo-Hookean energy model is disclosed which does not include terms that can produce singularities, or require the use of arbitrarily selected clamping parameters. The stable Neo-Hookean energy may include a length-preserving term and volume-preserving term(s), and the volume-preserving terms themselves may include term(s) from a Taylor expansion of a logarithm of a measurement of volume. The stable Neo-Hookean energy may further include an origin barrier term that increases the difficulty of reaching the origin and expands a mesh in response to a perturbation when the mesh is at the origin. Closed-form expressions of eigenvalues and eigenvectors of a Hessian of the stable Neo-Hookean energy are disclosed, which may be used in a simulation of a material to, e.g., project the Hessian to semi-positive-definiteness in Newton iterations used to determine a substantially minimal energy configuration.

20 Claims, 6 Drawing Sheets

(56) References Cited

OTHER PUBLICATIONS

Isaac Chao, Ulrich Pinkall, Patrick Sanan, and Peter Schroder. 2010. A Simple Geometric Model for Elastic Deformations. ACM Trans. Graph. 29, 4, Article 38 (2010), 6 pages.

Aleka McAdams, Yongning Zhu, Andrew Selle, Mark Empey, Rasmus Tamstorf, Joseph Teran, and Eftychios Sifakis. 2011. Efficient elasticity for character skinning with contact and collisions. ACM Trans. Graph. 30, 4, Article 37 (Jul. 2011), 12 pages.

Matthias Müller, Julie Dorsey, Leonard McMillan, Robert Jagnow, and Barbara Cutler. 2002. Stable Real-time Deformations. In ACM SIGGRAPH/Eurographics Symp. Comp. Anim. 49-54.

Alexey Stomakhin, Russell Howes, Craig Schroeder, and Joseph M. Teran. 2012. En-ergetically Consistent Invertible Elasticity. In ACM SIGGRAPH/Eurographics Symp. Comp. Anim. 25-32.

Joseph Teran, Eftychios Sifakis, Geo rey Irving, and Ronald Fedkiw. 2005. Robust Quasistatic Finite Elements and Flesh Simulation. In ACM SIGGRAPH/Eurographics Symp. Comp. Anim. 181-190.

* cited by examiner

US 10,366,184 B1

STABLE NEO-HOOKEAN FLESH SIMULATION

BACKGROUND

Field

The present disclosure relates to the field of computer animation, and in particular to simulating and rendering volume-preserving materials.

Description of the Related Art

With the increasingly wide-spread availability of computers, many graphic artists and animators rely upon computers to assist in the production process for the creation of animations, computer-generated imagery (CGI), and the like. In doing so, the artists and animators may create virtual models stored in computer memory that represent physical models or other entities (e.g., fictitious characters). Typically, two-dimensional (2D) or three-dimensional (3D) computer-aided animation combines 2D/3D models of objects and programmed movement of one or more of the models. Models may be constructed, for example, out of geometrical vertices, faces, and edges forming a mesh in a 3D coordinate system to represent the objects. These virtual models can be manipulated using computers to, for example, simulate physics, design aesthetic actions such as poses or other deformations, create lighting, coloring and paint, or the like, of characters or other elements of a computer animation display.

Non-linear hyperelastic energies have been used to model deformations in computer animations of materials including the flesh of virtual characters. However, it has been notoriously difficult to accurately and robustly simulate the volume-preserving properties of real-world biological tissues.

SUMMARY

One embodiment of this disclosure provides a computer-implemented method for rendering one or more images depicting a material. The method generally includes receiving a volumetric mesh in an initial configuration, and determining a configuration of the volumetric mesh which substantially minimizes an energy model characterizing deformation of the volumetric mesh. The energy model includes a length-preserving term, one or more volume-preserving terms, and an origin barrier term, and the volume-preserving terms do not include singularities. The method further includes posing a surface mesh based, at least in part, on the determined configuration of the volumetric mesh. In addition, the method includes rendering one or more images using at least the posed surface mesh.

Other embodiments include, without limitation, a computer-readable medium that includes instructions that enable a processing unit to implement one or more embodiments of the disclosed method, as well as a system configured to implement one or more aspects of the disclosed method.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
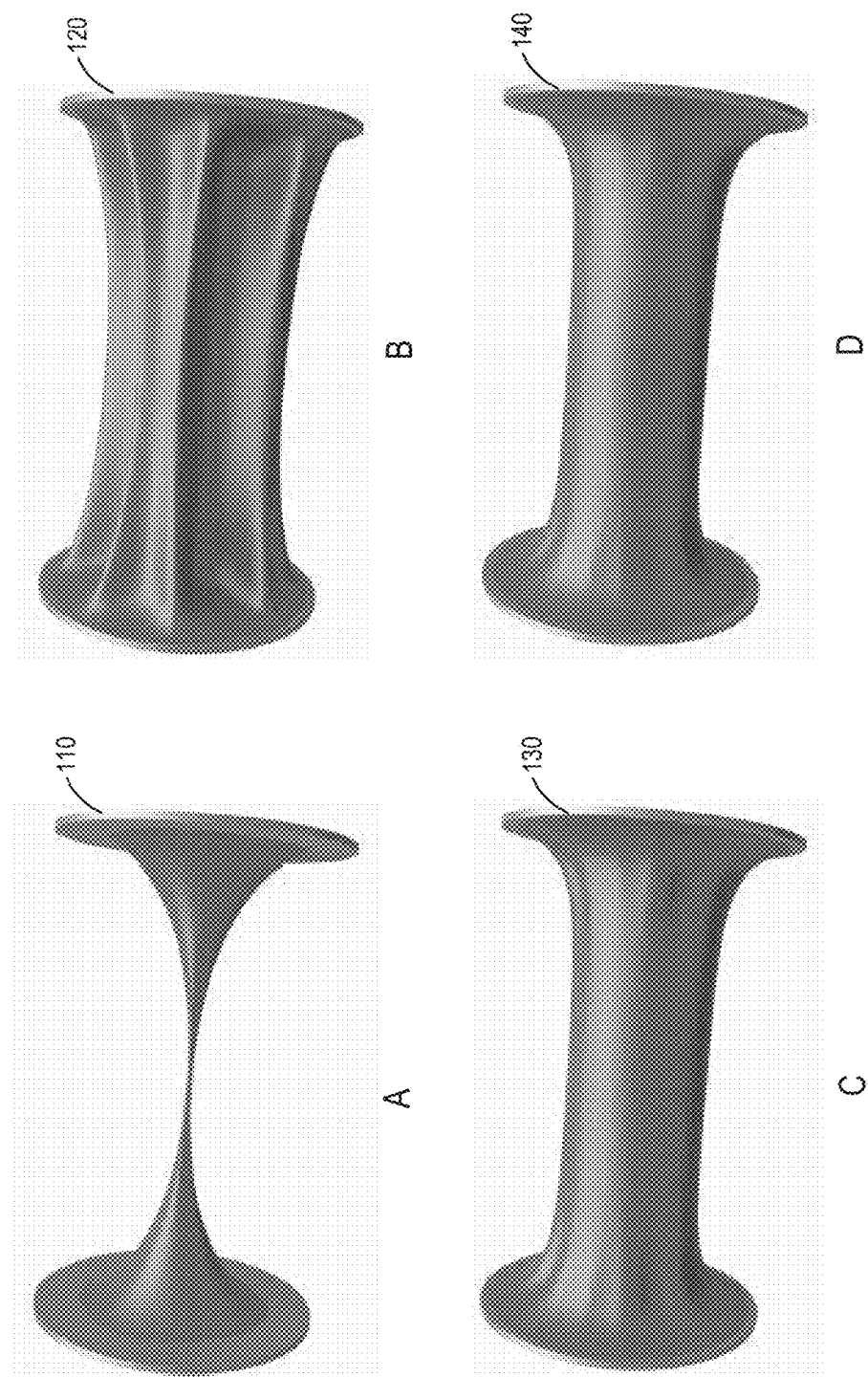
FIG. 1 illustrates example simulations of cylinders that are stretched using various elastic energy models including a stable Neo-Hookean elasticity model, according to an embodiment.

Non-linear hyperelastic elastic energies have been used in flesh simulations to model the deformations of biological tissues, such as muscle and fat in virtual characters (e.g., virtual humans). Various extensions of Hooke's law, F=kx, to three dimensions have been used as elastic energy models, including the co-rotational and Neo-Hookean energy models. However, biological tissues require volume preservation, which is reflected in their high Poisson's ratios $\mu \in [0.45, 0.5)$ and corresponding visual features that emerge. Traditional elastic energy models such as the co-rotational model do not preserve volume well. Neo-Hookean energy models do preserve volume but contain singularities at which simulations using such models become numerically intractable. As used herein, a "singularity" in an energy model refers to a point where one or more terms of the energy model, and therefore the energy model itself, becomes infinite (either positive or negative). Clamping parameters have been used to prevent Neo-Hookean energy models from exploding to infinity at singularities. However, the values of such clamping parameters are selected arbitrarily, and it can be unclear what values should be used.

Embodiments presented herein provide a stable Neo-Hookean energy model which does not include terms that can produce singularities, or use arbitrarily selected clamping parameters. The stable Neo-Hookean energy may be used to simulate and render materials such as flesh that require volume preservation. In one embodiment, the stable Neo-Hookean energy may include a length-preserving term and one or more volume-preserving terms which do not have singularities. In particular, the volume-preserving terms of the stable Neo-Hookean energy may include one or more terms from a Taylor expansion of a logarithm of a measurement of volume. The stable Neo-Hookean energy may further include an origin barrier term that increases the difficulty of reaching the origin (where a mesh is collapsed to a point) and expands the mesh in response to a perturbation when the mesh is at the origin. In addition, closed-form expressions of eigenvalues and eigenvectors of a Hessian of the stable Neo-Hookean energy (as well as other energies) are disclosed, and such eigenvalues and eigenvectors may be used in a simulation of a material to, e.g., project the Hessian to semi-positive-definiteness in Newton iterations used to determine a substantially minimal energy configuration. In one embodiment, a simulation application may receive a volumetric mesh in an initial configuration and determine a new configuration of the volumetric mesh that substantially minimizes the stable Neo-Hookean energy using a numerical method such as a Newton-based implicit scheme that uses a conjugate gradient solver. To determine the new configuration that substantially minimizes the stable Neo-Hookean energy, the simulation application may, for each of a number of iterations, determine a first (i.e., the gradient) derivative and second (i.e., the Hessian) of the stable Neo-Hookean energy as well as eigenvalues and eigenvectors of the Hessian; set negative eigenvalues (if any) to zero; use the gradient, Hessian, eigenvectors, and eigenvalues in a Newton solve to determine a correction vector that is a (better) guess of the minimum energy configuration of the volumetric mesh; and perform an additional line search to determine whether the correction vector can be improved by scaling the correction vector. The simulation application may then pose a surface mesh using the determined configuration of the volumetric mesh and render the surface mesh to one or more images that can be display via a display device.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., a simulation application) or related data available in the cloud. For example, the simulation application could execute on a computing system in the cloud and simulate and render images of various materials such as flesh according to techniques disclosed herein, and then store the rendered images at a storage location in the cloud. Doing so allows a user to access this information from any computing system attached to a network connected to the cloud (e.g., the Internet).

Stable Neo-Hookean Energy

FIG. 1 illustrates example simulations of cylinders 110-140 that are stretched using various elastic energy models, including a stable Neo-Hookean elasticity model according to an embodiment. Panel A shows a simulation using the co-rotational elasticity model, panel B shows a simulation using the fixed co-rotational model, panel C shows a simulation using the filtered Neo-Hookean model, and panel D shows a simulation using the stable Neo-Hookean model, each of which is discussed in greater detail below. Illustratively, the co-rotational model in panel A fails to preserve volume of the cylinder 110, which has lost volume as a result of stretching during the simulation. The simulation in panel B using the fixed co-rotational model produces sharp and unnatural fins in the cylinder 120, while the simulation in panel C using the filtered Neo-Hookean model produces a rubber-like appearance of the cylinder 130. The simulation in panel D uses the stable Neo-Hookean model to stretch the cylinder 140 and retains the rubber-like appearance of the simulation using the filtered Neo-Hookean model, but is better at preserving volume.

The fundamental measure of non-linear deformation is the deformation gradient F, the columns of which are labeled as vectors and the elements of which are labeled as scalars in equation (1):

$$F = [f_0 \mid f_1 \mid f_2] = \begin{bmatrix} f_0 & f_3 & f_6 \\ f_1 & f_4 & f_7 \\ f_2 & f_5 & f_8 \end{bmatrix}. \quad (1)$$

Quantities derived from the deformation gradient F that are discussed herein include its polar decomposition F=RS, the relative change in volume of a material given by the determinant of the deformation gradient J=det(F), the right Cauchy-Green tensor C=$F^T$F, the first right Cauchy-Green invariant $I_C$=tr(C), and the rotation variant singular value decomposition (SVD) of the deformation gradient F, which can be written as $$F = U\Sigma V^T \text{ and } \Sigma = \begin{bmatrix} \sigma_0 & 0 & 0 \\ 0 & \sigma_1 & 0 \\ 0 & 0 & \sigma_2 \end{bmatrix}. \quad (2)$$

Unlike the standard SVD convention, the rotation variant of the SVD moves reflections to Σ, so U and V are rotations with det(U)=det(V)=1 and Σ is allowed to have a negative entry.

The elastic behavior of a deformable body may be specified in terms of a hyperelastic energy density Ψ. For example, the simulation shown in panel A uses the following co-rotational (CR) material model as the hyperelastic energy density:

$$\Psi_{CR} = \mu\|F - R\|_F^2 + \frac{\lambda}{2}tr^2(S - I), \quad (3)$$

where μ and λ are Lamé constants, R and S form the polar decomposition of F, and I is the 3×3 identity matrix. Forces may be derived from energy by several means, with one approach being to use the first Piola-Kirchoff (PK1) stress tensor, which is denoted herein as P(F). The PK1 for the co-rotational material model is:

$$P_{CR}(F) = \frac{\partial \Psi}{\partial F} = R[\mu(S - I) + \lambda tr(S - I)I]. \quad (4)$$

Techniques are known for integrating over a volume V and changing variables to vertex displacements u, thereby producing the matrix $$VP(F)\frac{\partial F}{\partial u}$$

whose columns are vertex forces and which has a term $$\frac{\partial F}{\partial u}$$

that varies based on element type, e.g., tetrahedral or hexahedra and basis type, e.g., linear or quadratic.

A drawback of non-linear hyperelastic energies, such as the co-rotational material model described above, is that such energies can include singularities where certain terms explode to infinity. Various techniques have been used to avoid such singularities. The fixed co-rotational model and filtered Neo-Hookean model of panels B-C overcome singularities by using clamping parameters to prevent their terms from exploding to infinity. One approach for doing so relies on force filtering, in which the rotational variant SVD is used to write a filtered stress tensor P(Σ) defined in F's principal stretch space Σ, and the tensor Σ is clamped to a constant or linear function for specific values of Σ where P(Σ) is known to behave badly (i.e., go to infinity). Another approach guarantees the positive definiteness of the 4$^{th}$ order tensor $$\frac{\partial P(F)}{\partial F}$$

by diagonalizing the tensor into one 3×3 and three 2×2 matrices and clamping eigenvalues of the tensor $$\frac{\partial P(F)}{\partial F}$$

to a finite threshold. To ensure that Ψ, P(F), and $$\frac{\partial P(F)}{\partial F}$$

do not drift out of sync, the filter may also be applied directly to the hyperelastic energy density Ψ, which may be used in either of the fixed co-rotational and filtered Neo-Hookean models.

The clamping techniques described above require the arbitrary selection of clamping parameter value(s), and it can be unclear what values a user should select. By contrast, the stable Neo-Hookean model of panel D is a hyperelastic energy that does not require clamping and has the properties of inversion stability, reflection stability, rest stability, and meta-stability under degeneracy. As used herein, inversion stability means the energy is singularity-free, such that the stable Neo-Hookean model does not need filters or thresholds; reflection stability means the energy is well-behaved regardless of the reflection convention used in the SVD; rest stability means an element's rest shape is preserved under zero load, and meta-stability under degeneracy means under point, line, and plane degeneracies, forces are defined up to rotation.

The stable Neo-Hookean model according to an embodiment may be derived as follows. Starting with the most commonly used version of Neo-Hookean elasticity (other versions of Neo-Hookean elasticity have also been proposed):

$$\Psi_{Neo} = \frac{\mu}{2}(I_C - 3) - \mu \log J + \frac{\lambda}{2}(\log J)^2, \quad (5)$$

the Valanis-Landel hypothesis posits that many hyperelastic energies can be separated into length (1D), area (2D), and volume (3D) components, with the 1D length term of equation (5) being $$\frac{\mu}{2}(I_C - 3)$$

and the energy $$\Psi_M = \frac{\mu}{2}(I_C - 3),$$

which has been dubbed the "Neo-Hookean" energy. When unconstrained, the Neo-Hookean energy $\Psi_M$ achieves its minimum when the element has collapsed to zero volume, i.e., when $I_C$=0 and $\Psi_M$=−3. An additional hard constraint J=1 may be imposed so that the energy is minimized at the volume-preserving configuration that is closest to the stretch space origin. Here, J is a measurement of the volume of the mesh being simulated, and J is normalized to 1 such that if J=1, then the volume is perfectly preserved, and if J is greater than 1, then volume is not preserved. Even without the hard constraint that J=1, however, $\Psi_M$ is well behaved under inversion, and the energy relative to a zero-volume configuration is well-defined irrespective of an element's current state. In some embodiments, the stable Neo-Hookean model also includes such $\Psi_M$ length term, as discussed in greater detail below.

The remaining terms of the elasticity equation (5) (and some other Neo-Hookean energies) are volume-preserving penalty terms. The volume terms from equation (5) are:

$$\Psi_{Neo,volume} = -\mu \log J + \frac{\lambda}{2}(\log J)^2. \quad (7)$$

In addition to growing unbounded as J→0 due to the logarithms in equation (7), the volume terms become infeasible for J<0, which corresponds to inversions in which, e.g., a material is pushed inside-out. It should be understood that any energy model with logarithm(s) will have such problems. In one embodiment, the stable Neo-Hookean model includes a different volume term of the form $$\frac{\lambda}{2}(J-1)^2,$$

which unlike equation (7) is bounded, well-defined and invertible, sidestepping the need for inversion handling.

$$\frac{\lambda}{2}(J-1)^2$$

Although the $\Psi_M$ length term plus the volume term discussed above, i.e., $$\Psi_D = \frac{\mu}{2}(I_C - 3) + \frac{\lambda}{2}(J-1)^2,$$

is a promising candidate for a stable Neo-Hookean model, such a model has several drawbacks. In particular, $\Psi_D$ possesses inversion stability but lacks rest stability. That is, PK1 should resolve to zero at identity, indicating that the energy has been extremized. Otherwise, forces appear when the body is at rest and overwrite the intended rest state with a different, parameter-dependent state. Intuitively, the problem is that the effective rest state no longer coincides with J=1 but instead coincides with a smaller J that causes an element to slightly deflate. One embodiment solves this problem by inflating each element so that, when the element deflates, the element settles to rest at J=1. Consider the PK1 of $\Psi_D$:

$$P_D(F) = \mu F + \lambda \frac{\partial J}{\partial F}(J-1). \quad (8)$$

An energy is rest stable if $P_D(F)=0$, but $P_D(I)$ is nonzero:

$$P_D(I) = \mu I + \lambda \frac{\partial \det(I)}{\partial F}(\det(I)-1) = \mu I. \quad (9)$$

To recover rest stability, in one embodiment, $(J-1)^2$ is modified to shift the root from 1 to $\alpha$, i.e., the element is inflated to a volume greater than one:

$$\begin{cases} \Psi_E = \frac{\mu}{2}(I_C - 3) + \frac{\lambda}{2}(J - \alpha)^2 \\ P_E(F) = \mu F + \lambda \frac{\partial J}{\partial F}(J - \alpha) \end{cases}.$$

Solving for an $\alpha$ that satisfies $P_E(I)=0$ yields $\alpha=1+\mu/\lambda$:

$$\Psi_E = \frac{\mu}{2}(I_C - 3) + \frac{\lambda}{2}\left(J - 1 - \frac{\mu}{\lambda}\right)^2. \quad (10)$$

The quadratic term in equation (10) can additionally be expanded to give:

$$\Psi_E = \frac{\mu}{2}(I_C - 3) + \frac{\mu}{2}(J - 1) + \frac{\lambda}{2}(J - 1)^2 + \left(\frac{\mu}{\lambda}\right)^2. \quad (11)$$

As constants disappear under differentiation, the material model of equation (11) is functionally equivalent to:

$$\Psi_E = \frac{\mu}{2}(I_C - 3) + \frac{\mu}{2}(J - 1) + \frac{\lambda}{2}(J - 1)^2. \quad (12)$$

The stable neo-Hookean energy $\Psi_E$ of equation (12) shares some similarities with the Neo-Hookean energy $\Psi_{Neo}$ from equation (5), except the log J terms have been replaced with J−1, thereby removing the singularities in $\Psi_{Neo}$. In particular, the $$\frac{\mu}{2}(I_C - 3)$$

term of the stable neo-Hookean energy $\Psi_E$ attempts to preserve the lengths of the mesh being deformed in x, y, and z directions, with $I_C$ representing a length that a spring is extended and −3 measuring how far the spring is extended in x, y, and z directions (i.e., the further from 3, the more the spring is extended). For example, if the mesh were stretched or squished in one direction, the $$\frac{\mu}{2}(I_C - 3)$$

term would attempt to restore the original length in that direction. However, preserving lengths does not necessarily preserve volume, and the $$\frac{\mu}{2}(J - 1) \text{ and } \frac{\lambda}{2}(J - 1)^2$$

terms attempt to preserve the volume of the mesh by, e.g., stretching out in one direction when another direction experiences compression. That is, under external deformations, the stable Neo-Hookean energy $\Psi_E$ may be used to attempt to find a closest configuration of the mesh that preserves lengths and volumes. If the stable Neo-Hookean energy is reduced to exactly 0, then volume and lengths are perfectly preserved, such as by returning the mesh to its original configuration. However, in practice, the stable Neo-Hookean energy may only be close to zero, meaning the simulation is close to but not exactly restoring the original volume and lengths of the mesh.

In equation (12), J−1 is the first term in the Taylor series of log J at J=1, so the stable Neo-Hookean energy $\Psi_E$ is a polynomial that is essentially a singularity-removing Taylor truncation of $\Psi_{Neo}$ about a volume preserving state, resulting in an inversion and rest stable material model. In other embodiments, additional, higher order terms from the Taylor series may be utilized in the energy as well. In order to establish a common basis for comparison with the co-rotational energy, it can be shown that linearizing $\Psi_{Neo}$ yields co-rotational elasticity to within a constant. Starting from the energy in equation (5), $$\Psi_{Neo} = \frac{\mu}{2}(I_C - 3) - \mu \log J + \frac{\lambda}{2}(\log J)^2,$$

the linearization log J≈tr(S−I) may be used to establish that $$\frac{\mu}{2}(I_C - 3) - \mu \log J \approx \frac{\mu}{2}\|F - R\|_F^2,$$

$$\frac{\lambda}{2}(\log J)^2 \approx \frac{\lambda}{2}tr^2(S - I),$$

leading to the conclusion that $$\Psi_{CR} = \frac{\mu}{2}\|F - R\|_F^2 + \frac{\lambda}{2}tr^2(S - I).$$

Note that $\Psi_{CR}$ includes a z rather than the μ from equation (3), as the linearization introduces a factor of two that should be accounted for using a Lamé reparameterization.

In contrast to the co-rotational model of panel A, which approximates log J in the Neo-Hookean energy $\Psi_{Neo}$ as log J≈tr(S−I), the stable Neo-Hookean energy $\Psi_E$ approximates log J as log J≈J−1. When the co-rotational model approximation log J≈tr(S−I) is used, the actual volume J=$\sigma_0 \sigma_1 \sigma_2$ is no longer computed, and it is instead assumed that $(\sigma_0\sigma_1\sigma_2-1) \approx (\alpha_0+\alpha_1+\alpha_2-3)$, which actually only holds for small deformations where ($\{\sigma_i\}$ is near 1. As a result, the co-rotational model can incorrectly indicate that volume has been preserved when, e.g., elements have been crushed to zero volume or inverted. The "fixed" co-rotational model of panel B has form $$\Psi_{FixCR} = \mu\|F - R\|_F^2 + \frac{\lambda}{2}(J-1)^2,$$

which applies the same problematic linearization $\log J \approx \text{tr}(S-I)$ to the log J term of the Neo-Hookean energy $T_{Neo}$ of equation (5). As a result, while the fixed co-rotational model $\Psi_{FixCR}$ is more stable than the co-rotational model $\Psi_{CR}$, the fixed co-rotational model $\Psi_{FixCR}$ also introduces visual artifacts under large deformations. Other models, such as the St. Venant-Kirchoff (SvKT) energy, may also produce artifacts.

In addition to being volume-preserving, the stable Neo-Hookean energy $\Psi_E$ is reflection stable, as the $I_C$ term in the stable Neo-Hookean energy $\Psi_E$ involves the squared singular values of F, so any negation convention is irrelevant. As the J term is the product of the singular values, the sign convention is also irrelevant. Similar reasoning may be used for the derivative of the stable Neo-Hookean energy PK1, and the Hessian (i.e., the second derivative of the stable Neo-Hookean energy) is agnostic to sign convention as well, as discussed in greater detail below.

As described, the stable Neo-Hookean energy $\Psi_E$ of equation (12) has the properties of inversion, reflection, and rest stability. The behavior of such an energy model under degeneracy, i.e., when an element has been crushed to a plane, line, or point, is as follows. When an element is crushed to a plane, the stable Neo-Hookean energy $\Psi_E$ is stable, with material forces appearing along the normal direction to the plane and working to restore the element's original shape. When an element is crushed to a line, the stable Neo-Hookean energy $\Psi_E$ is meta-stable, with forces resolving to zero but the Hessian being negative definite. For a material that is invertible, such a meta-stable state is correct. If an unconstrained element has been crushed to exactly a line, the shape the element should return to is underdetermined, as the configuration is equidistant from all possible rotations of the original shape about the line. Negative definiteness guarantees that any perturbation (e.g., momentum) will select a rotation, and the element will self-restore. However, when an element is crushed to a point, i.e., F=0, the forces disappear and the Hessian is positive definite, meaning the configuration will remain stable even in the presence of perturbations. Such a stable behavior is undesirable, even though the basin of attraction is vanishingly small for Poisson's ratios that correspond to biological tissue ($\nu$>0.45), and one embodiment corrects this undesirable behavior by including, in the stable Neo-Hookean energy model, a regularized origin barrier term $\log(I_C+\delta)$ that inserts a peak of negative-definiteness about F=0, with $\delta$ being used to smooth away the logarithmic singularity and the value $\delta$=1 producing semi-definiteness at F=0. It should be understood that the origin is where all lengths of the mesh have been reduced to zero (i.e., crushed to a point), and the origin barrier increases the difficulty of reaching the origin as well as expands the mesh in response to a perturbation when the mesh is at the origin, so that the mesh is metastable and will expand into it the original form when perturbed. With the origin-barrier term, the stable Neo-Hookean energy model becomes:

$$\Psi_{New} = \frac{\mu}{2}(I_C - 3) + \frac{\lambda}{2}(J - \alpha)^2 + \frac{\mu}{2}\log(I_C + 1), \quad (13)$$

with the rest-stability term being shifted to $$\alpha = 1 + \mu/\lambda - \left(\frac{\mu}{4}\right)\lambda.$$

Given the energy model of equation (13), the material parameters $\mu$ and $\lambda$ may be reparameterized in order to maintain consistency with Hooke's law. In one embodiment, the values of $\mu$ and $\lambda$ may be shifted so that the energy model produces the PK1 of linear elasticity, having the form $$P(F) = 2\mu_{Lamé}\epsilon + \lambda_{Lamé}tr(\epsilon)I, \quad (14)$$

where $$\epsilon = \frac{1}{2}(F + F^T) - I$$

is the linearized strain tensor and the coefficients $\mu_{Lamé}$ and $\lambda_{Lamé}$ are the Lamé parameters in linear elasticity. The linearization of the stress derived from equation (13) becomes consistent with this expression if $\mu$ and $\lambda$ are set to $\mu = 4/3\mu_{Lamé}$ and $$\lambda = \lambda_{Lamé} + \frac{5}{6}\mu_{Lamé}.$$

The expression for Poisson's ratio then shifts to:

$$\nu = \frac{\lambda - \left(\frac{5}{8}\right)\mu}{2\left(\lambda + \left(\frac{1}{8}\right)\mu\right)}. \quad (15)$$

The same methodology may be applied to any of the previously described energies. In particular, the parameterization of equation (12) yields $P = \mu_{Lamé}$, $\lambda = \lambda_{Lamé} + \mu_{Lamé}$, and $$\nu = \frac{\lambda - \mu}{2\lambda}.$$

Using equation (15), it can be shown that the energy model of equation (13) does not introduce spurious minima over the range $$\nu = \frac{\lambda - \mu}{2\lambda} \text{ and,}$$

in particular, the critical points of $\Psi_{New}$ (including maxima and saddle points) only appear under uniform scaling, while spurious minima only appear when $$\frac{\lambda}{\mu} < 0.1525.$$

This corresponds to the auxetic regime of ν≤−0.85, meaning the model of equation (13) is stable for any μ∈[0,0.5).

Figure 2:
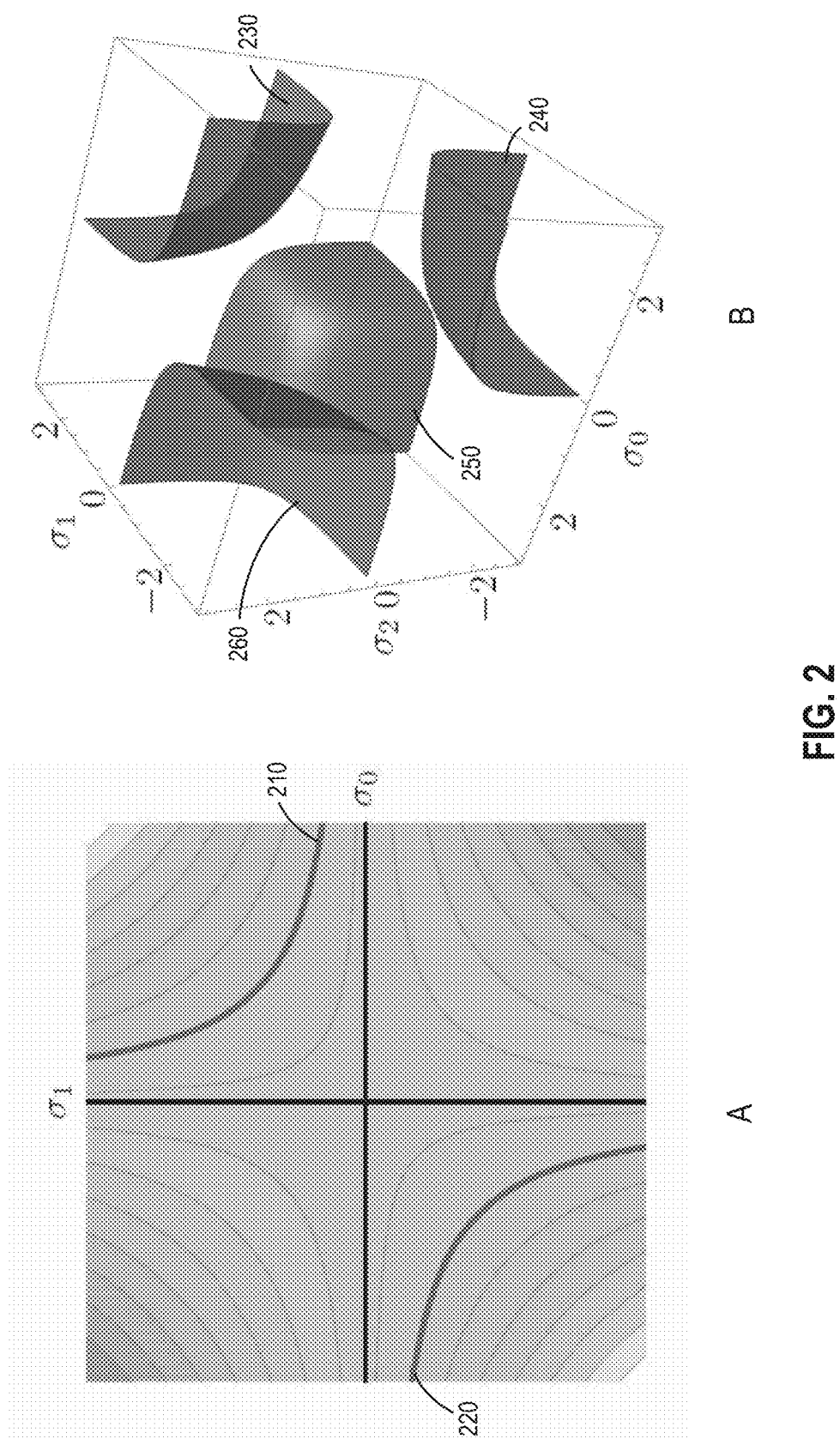
FIG. 2 illustrates a set of volume-preserving configurations in two and three-dimensional stretch space, according to an embodiment.

FIG. 2 illustrates a set of volume-preserving configurations in two and three-dimensional stretch space, according to an embodiment. In particular, the geometry of J=det(F) is shown in principal stretch space. The axes shown represent stretches in different directions (e.g., an element being stretched in the x or y directions). As shown in panel A, the set of volume-preserving configurations of a mesh in two-dimensional stretch space form two distinct, disconnected sets shown as the curves 210 and 220, reflecting the non-convexity of J=det(F). As described, volume preservation is a desirable property in flesh simulations, and the curves 210 and 220 represent configurations of the mesh, which a simulation application may attempt to reach, that preserve volume. In particular, the volume-measuring J terms in the stable Neo-Hookean energy $\Psi_{New}$ are used to measure distances from the volume-preserving curves 210 and 220 and to encourage the simulation to get as close as possible to one of the curves 210 and 220. It should be understood that other energy models such as the co-rotational energy of equation (3) do not include such volume-measuring J terms. The stable Neo-Hookean energy's saddle-point structure is also shown. Volume-preserving configurations are energetically equivalent, so points outside the curve have no preferred Newton direction, even when the energy is squared, e.g., $(J-1)^2$. Additional regularization is needed to resolve this ambiguity, which is the role played by the other terms in $$\frac{\partial^2 \Psi}{\partial F^2}.$$

The situation worsens in three dimensions, shown in panel B, as the set of volume-preserving configurations of the mesh form four components, 230-260, with the saddle points needing to be regularized.

Energy Eigenanalysis and Complete Eigensystem

Figure 3:
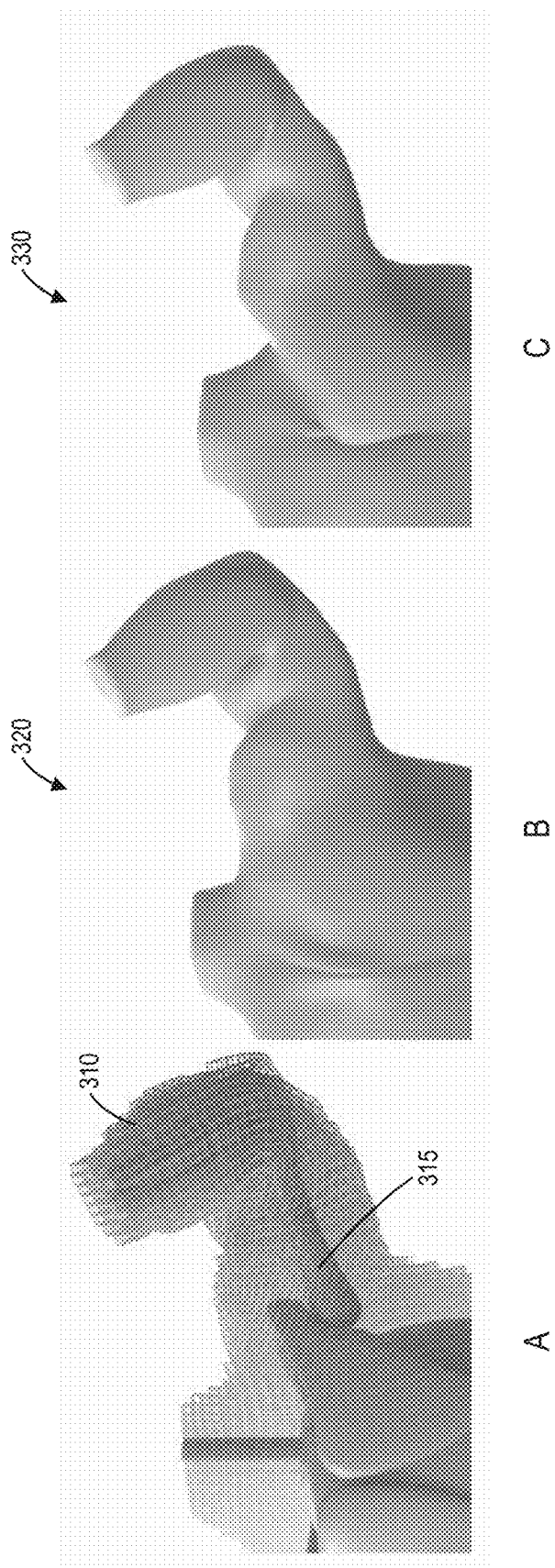
FIG. 3 illustrates example images rendered used various flesh simulations including a Neo-Hookean elasticity model simulation, according to an embodiment.

FIG. 3 illustrates example images rendered used various flesh simulations including a Neo-Hookean elasticity model simulation, according to an embodiment. In one embodiment, a simulation application may perform quasistatic simulations using a Newton solver augmented with a linear search in order to determine a configuration of a volumetric mesh that substantially minimizes the stable Neo-Hookean energy, and the simulation application may then pose and render a surface mesh using the determined configuration, as discussed in greater detail below. Panel A shows an example volumetric mesh, representing the arms and torso of a character, that is a hexahedral lattice mesh 310 with 45,809 elements and 156,078 degrees of freedom and is driven by 13 internal skeletal bones 215. Illustratively, a quasistatic simulation uses the stable Neo-Hookean energy, and a Poisson's ratio of ν=0.488, in a number of Newton iterations that converge to a minimum of the stable Neo-Hookean energy, in order to determine an energy-minimizing configuration of the hexahedral mesh. The determined configuration of the hexahedral mesh is then used to drag along a surface mesh that is rendered as the image 320 shown in panel B. As shown, wrinkles and bulges emerge from the stable Neo-Hookean energy's volume-preserving properties. Further, the skeletal bones 215 may be transformed by the skinning of a production rig, which often results in non-rigid transforms and intersecting bones, and the stable Neo-Hookean energy model is robust to such noisy inputs. Panel C shows a rendered image 330 of the same simulation using the co-rotational elasticity model discussed above and a Poisson's ratio of ν=0.488. As shown, the co-rotational model fails to preserve volume and produces artifacts, including collapsing the trapezius and forming a spurious fold around the shoulder blade. Increasing the Poisson ratio ν tends to worsen the artifacts.

In order to use the stable Neo-Hookean energy (and other energies) in the Newton solver augmented with the linear search, the first (gradient) and second (Hessian) derivatives of the energy need to be determined, as well as associated eigenvectors and eigenvalues of the Hessian, and eigenvalues of the Hessian that are negative also need to be clamped to zero, as discussed in greater detail below. However, the eigenstructure, including the eigenvalues and eigenvectors, of the Hessian has traditionally not been understood. The following discusses an eigenanalysis of the stable Neo-Hookean energy (as well as other energies) and a complete eigensystem, including the eigenvalues and eigenvectors of the Hessian and expressions describing the interactions of some eigenvectors.

A complete eigenanalysis of equation (13) is possible. In particular, closed-form eigenvalues and eigenvectors may be constructed of each of the terms in the Hessian, and a compact expression obtained for the eigendecomposition of their sum. Such expressions may be used to construct positive semi-definite versions of the Hessian and to provide a qualitative understanding of the energy. As used herein, vectorization vec(•) is defined as column-wise flattening of a matrix into a vector:

$$A = \begin{bmatrix} a & c \\ b & d \end{bmatrix} \quad vec(A) = \begin{bmatrix} a \\ b \\ c \\ d \end{bmatrix}. \tag{16}$$

Since vec(A) is a vector, it may be denoted as a, but a symbol • is added herein to indicate it is a vectorized matrix, i.e., vec(A)=ă. In addition, $4^{th}$ order tensors are denoted in matrix-of-matrices form using blackboard bold:

$$\mathbb{A} = \begin{bmatrix} \begin{bmatrix} a & b \\ c & d \end{bmatrix} & \begin{bmatrix} i & k \\ j & l \end{bmatrix} \\ \begin{bmatrix} e & g \\ f & h \end{bmatrix} & \begin{bmatrix} m & o \\ n & p \end{bmatrix} \end{bmatrix} = \begin{bmatrix} [A_{00}] & [A_{01}] \\ [A_{10}] & [A_{11}] \end{bmatrix}.$$

When vec(•) is applied, two unfoldings reorder the $4^{th}$ order tensor into a $2^{nd}$ order matrix:

$$vec(\mathbb{A}) = [vec(A_{00}) | vec(A_{10}) | vec(A_{01}) | vec(A_{11})]$$

$$= \begin{bmatrix} a & e & i & m \\ b & f & j & n \\ c & g & k & o \\ d & h & l & p \end{bmatrix} = \bar{A}$$

That is, the $4^{th}$ order tensor may be flattened out into a $2^{nd}$ order matrix. To emphasize that a matrix is a vectorized ("flattened") tensor, the $\check{\bullet}$ notation is again used, as shown in Å above. This vectorization convention allows several expressions to be written in terms of cross products.

Starting from the PK1 for equation (13), $$P(F) = \mu\left(1 - \frac{1}{I_C + 1}\right)F + \lambda(J - \alpha)\frac{\partial J}{\partial F}, \quad (17)$$

where $$\alpha = 1 + \frac{\mu}{\lambda} - \left(\frac{\mu}{4}\right)\lambda,$$

and using the column-wise notation for F from equation (1) and the identity $J = f_0 \cdot (f_1 \times f_2)$, the cofactor matrix $$\frac{\partial J}{\partial F}$$

may be rewritten as cross products:

$$\frac{\partial J}{\partial F} = [f_1 \times f_2 \mid f_2 \times f_0 \mid f_0 \times f_1]. \quad (18)$$

This is a convenient shorthand for computing $$\frac{\partial J}{\partial F}$$

and useful when analyzing $$\frac{\partial^2 J}{\partial F^2}.$$

Further, using the scalar notation for F from equation (1), the Hessian of the energy may be written in 4-th order matrix-of-matrices form as $$\frac{\partial^2 \Psi}{\partial F^2} = \frac{\partial P(F)}{\partial F} = \begin{bmatrix} \left[\frac{\partial P(F)}{\partial f_0}\right] & \left[\frac{\partial P(F)}{\partial f_3}\right] & \left[\frac{\partial P(F)}{\partial f_6}\right] \\ \left[\frac{\partial P(F)}{\partial f_1}\right] & \left[\frac{\partial P(F)}{\partial f_4}\right] & \left[\frac{\partial P(F)}{\partial f_7}\right] \\ \left[\frac{\partial P(F)}{\partial f_2}\right] & \left[\frac{\partial P(F)}{\partial f_5}\right] & \left[\frac{\partial P(F)}{\partial f_8}\right] \end{bmatrix}, \quad (19)$$

where each entry is defined as $$\frac{\partial P(F)}{\partial f_i} = \quad (20)$$

$$\mu\left(1 - \frac{1}{I_C + 1}\right)\frac{\partial F}{\partial f_i} + \mu\frac{2}{(I_C + 1)^2}Ff_i + \lambda\frac{\partial J}{\partial F}\frac{\partial J}{\partial f_i} + \lambda(J - \alpha)\frac{\partial^2 J}{\partial F \partial f_i},$$

and each $$\frac{\partial P(F)}{\partial f_i} \in \mathbb{R}^{3 \times 3}.$$

In the following, the $$\mu\left(1 - \frac{1}{I_C + 1}\right)\frac{\partial F}{\partial f_i}$$

term of equation (20) will be referred to as the Tikihonov term $T_i$, the $$\mu\frac{2}{(I_C + 1)^2}Ff_i$$

term will be referred to as the Mu term $M_i$, the $$\lambda\frac{\partial J}{\partial F}\frac{\partial J}{\partial f_i}$$

term will be referred to as the volume Gradient term $G_i$, and the $$\lambda(J - \alpha)\frac{\partial^2 J}{\partial F \partial f_i}$$

term will be referred to as the volume Hessian term $H_i$. The complete Hessian is then the sum of such terms:

$$\frac{\partial^2 \Psi}{\partial F^2} = \mu\left(1 - \frac{1}{I_C + 1}\right)\mathbb{T} + \frac{\mu^2}{(I_C + 1)^2}\mathbb{M}(F) + \lambda\mathbb{G}(F) + \lambda(J - \alpha)\mathbb{H}(F). \quad (21)$$

A complete eigensystem may be built from the sum in equation (21). As $$\frac{\partial F}{\partial f_i}$$

is zero except in the ith entry, the Tikhonov term becomes an identity matrix under vectorization:

$$vec(\mathbb{T}) = \check{T} = I, \quad (22)$$

where I denotes a 9×9 identity matrix. This matrix is full-rank, positive-definite, independent of the values in F, and serves as a diagonal (Tikhonov) regularizer for the rest of the energy.

For the Mu term, the deformation gradient F may be vectorized into a 9-vector, $vec(F) = \check{f}$, which allows the tensor to be written as an outer product:

$$vec(\mathbb{M}) = \check{M} = \check{f}\check{f}^T, \quad (23)$$

which is a rank-one matrix having a single non-zero eigenvalue, $$\|\check{f}\|_2^2 = \|F\|_F^2 = (\sigma_0^2 + \sigma_1^2 + \sigma_2^2), \quad (24)$$

where $\|\bullet\|_F$ denotes the Frobenius norm and $\{\sigma 1\}$ are the singular values from equation (2). The eigenvector is $\check{f}$ up to normalization: $\check{f}/\|\check{f}\|$. The eigenvalue is always non-negative, and if F contains a large stretch, the eigenvalue will be large as well.

The Gradient term has a similar structure. Using the vectorization vec $$vec\left(\frac{\partial J}{\partial F}\right) = \bar{g},$$

the tensor becomes an outer product:

$$vec(\mathbb{G}) = \bar{G} = \check{g}\check{g}^T. \tag{25}$$

Again, there is a single non-zero, non-negative eigenvalue:

$$\|\bar{g}\|_2^2 = \left\|\frac{\partial J}{\partial F}\right\|_F^2 \equiv [(\sigma_0\sigma_1)^2 + (\sigma_0\sigma_2)^2 + (\sigma_1\sigma_2)^2]. \tag{26}$$

The eigenvector is $\check{g}$ up to normalization: $\check{g}/\|\check{g}\|$.

As for the volume Hessian term, vectorizing $H_i$ reveals the structure $$vec(\mathbb{H}) = \bar{H} = \begin{bmatrix} 0 & -\hat{f}_2 & \hat{f}_1 \\ \hat{f}_2 & 0 & -\hat{f}_0 \\ -\hat{f}_1 & \hat{f}_0 & 0 \end{bmatrix}, \tag{27}$$

where the symbol $\check{}$ denotes a cross-product matrix:

$$\hat{x} = \begin{bmatrix} 0 & -x_2 & x_1 \\ x_2 & 0 & -x_0 \\ -x_1 & x_0 & 0 \end{bmatrix}. \tag{28}$$

The $\check{H}$ matrix forms a recursive cross product matrix. Equation (27) contains cross-product matrices, and its blocks form a macro-structure that is a cross-product matrix. The eigenvalues of the volume Hessian $\check{H}$ can be factored into two characteristic polynomials:

$$\epsilon^3 - tr(C)\epsilon - 2J = 0 \tag{29}$$

$$\epsilon^3 - tr(C)\epsilon^2 + \frac{1}{2}(tr^2(C) - tr(C^2))\epsilon - \det(C) = 0, \tag{30}$$

where C is the right Cauchy-Green tensor defined above and E denotes the eigenvalues of $\check{H}$. Equation (30) corresponds to the characteristic polynomial of C and can be solved. Given the roots of equation (3), which are $(\in_\alpha, \in_\beta, \in_\gamma)$, six of the eigenvalues of $\check{H}$ are $(\pm\sqrt{\in_\alpha}, \pm\sqrt{\in_\beta}, \pm\sqrt{\in_\gamma})$. The square roots of eigenvalues may be restated using the singular values of F:

$$\in_3=\sigma_0 \quad \in_6=-\sigma_0$$

$$\in_4=\sigma_1 \quad \in_7=-\sigma_1$$

$$\in_5=\sigma_2 \quad \in_8=-\sigma_2. \tag{31}$$

By computing the SVD of F, six of the eigenvalues of $\check{H}$ may be obtained. For the remaining three eigenvalues, equation (29) is a depressed cubic whose roots may be obtained directly:

$$\epsilon_k = 2\sqrt{\frac{I_C}{3}}\cos\left[\frac{1}{3}\left(\arccos\left(\frac{3J}{I_C}\sqrt{\frac{3}{I_C}}\right) + 2\pi k\right)\right] \tag{32}$$

$k = 0, 1, 2.$

The foregoing shows how to obtain all the eigenvalues of $\check{H}$. The negations in equation (31) and the $I_C$ and J terms in equation (32) render the reflection convention applied to the singular values irrelevant.

There are always negative values in the volume Hessian, as three of the six values $\in_3 \ldots \in_8$ are less than or equal to zero and the cosine function in $\in_0 \ldots \in_2$ guarantees that another one or two eigenvalues are negative. In addition, the other eigenvalues in $$\frac{\partial^2 \Psi}{\partial F^2}$$

are non-negative, so the volume Hessian is the only possible source of negative eigenvalues.

As for the eigenvectors of the volume hessian $\check{H}$, such eigenvectors can be written in terms of $\check{Q}$ from the eigen-decomposition $\check{H}=\check{Q}\Lambda\check{Q}^T$ or in the tensor form:

$$\mathbb{Q} = \begin{bmatrix} [Q_0] & [Q_3] & [Q_6] \\ [Q_1] & [Q_4] & [Q_7] \\ [Q_2] & [Q_5] & [Q_8] \end{bmatrix}. \tag{33}$$

In the tensor form, each eigenvector is a 3×3 matrix (rather than a 9-vector). Starting with the eigenvectors corresponding to equation (30), the eigenvector corresponding to $\in_3$ has structure $$Q_3 = \frac{1}{\sqrt{2}} U D_3 V^T \tag{34}$$

$$D_3 = \begin{bmatrix} 0 & 0 & 0 \\ 0 & 0 & 1 \\ 0 & -1 & 0 \end{bmatrix}, \tag{35}$$

where U and V are from the singular value decomposition of the deformation gradient F (equation (2)) and the $$\frac{1}{\sqrt{2}}$$

is a normalization factor. The eigenvector of equation (34) has a "pseudo-cross-product" structure in which the middle matrix $D_3$ is a cross product matrix for the basis vector $e_0 = [-1\ 0\ 0]^T$. For the special case where U=V, equation (34) becomes a standard cross product on the first column of U, i.e., $$Q_3 = \frac{1}{\sqrt{2}}\hat{u}_0,$$

Equation (34) has a more general form where U and V differ, and corresponds to an infinitesimal rotation along the $\sigma_0$ axis in stretch space.

The complementary eigenvector for $\in_6$ has a similar structure:

$$Q_6 = \frac{1}{\sqrt{2}} U D_6 V^T \tag{36}$$

$$D_6 = \begin{bmatrix} 0 & 0 & 0 \\ 0 & 0 & 1 \\ 0 & 1 & 0 \end{bmatrix}. \tag{37}$$

Note the negative has been removed from the last row of $D_6$. Further, $D_3$ has been multiplied by a reflection, making $Q_6$ a reflected pseudo-cross-product. This corresponds to an infinitesimal rotation along the antipodal axis to $D_3$. The eigenvectors for $Q_4$, $Q_5$, $Q_7$, and $Q_8$ follow analogously as the cross products for $e_1 = [0\ -1\ 0]^T$ and $e_2 = [0\ 0\ -1]^T$. The eigenvectors for the depressed cubic in equation (29) are also defined by U and V, but contain a diagonal $$Q_k = \frac{1}{q_k} U D_k V^T \quad k = 0 \ldots 2 \tag{38}$$

$$D_k = \begin{bmatrix} \sigma_0 \sigma_2 + \sigma_1 \epsilon_k & 0 & 0 \\ 0 & \sigma_1 \sigma_2 + \sigma_0 \epsilon_k & 0 \\ 0 & 0 & \epsilon_k^2 - \sigma_2^2 \end{bmatrix}, \tag{39}$$

where $q_k = \|D_k\|$ is a normalization factor. The first three eigenvectors $\in_{0\ldots 2}$ are specified by equations (38) and (39). The remaining six eigenvectors $\in_{3\ldots 8}$ are of the form:

$$Q_k = \frac{1}{\sqrt{2}} U D_k V^T.$$

The only differences are in the $D_i$ matrices, which are $$D_3 = \begin{bmatrix} 0 & 0 & 0 \\ 0 & 0 & 1 \\ 0 & -1 & 0 \end{bmatrix} \quad D_6 = \begin{bmatrix} 0 & 0 & 0 \\ 0 & 0 & 1 \\ 0 & 1 & 0 \end{bmatrix}$$

$$D_4 = \begin{bmatrix} 0 & 0 & 1 \\ 0 & 0 & 0 \\ -1 & 0 & 0 \end{bmatrix} \quad D_7 = \begin{bmatrix} 0 & 0 & 1 \\ 0 & 0 & 0 \\ 1 & 0 & 0 \end{bmatrix}$$

$$D_5 = \begin{bmatrix} 0 & 1 & 0 \\ -1 & 0 & 0 \\ 0 & 0 & 0 \end{bmatrix} \quad D_8 = \begin{bmatrix} 0 & 1 & 0 \\ 1 & 0 & 0 \\ 0 & 0 & 0 \end{bmatrix}$$

The closed-form expressions for individual terms discussed above provide a complete eigensystem, denoted herein as $\check{A}$ for Assembled. The vectorized version of equation (21) is:

$$\check{A} = \mu\left(1 - \frac{1}{I_C + 1}\right)I + \mu\frac{2}{(I_C + 1)^T}\check{f}\check{f}^T + \lambda\check{g}\check{g}^T + \lambda(J - \alpha)\check{H}. \tag{40}$$

Although deriving expressions for the eigenvalues of a sum of matrices is generally non-trivial, the stable Neo-Hookean energy $\Psi_{New}$ according to one embodiment has a special structure allowing simple expressions to be obtained from the complete eigensystem.

As the $$\mu\left(1 - \frac{1}{I_C + 1}\right)I$$

term in equation (40) is diagonal, this term has nine identical eigenvalues that can be directly added to the eigenvalues of an existing system. The main difficulty arises from computing the sum $$\mu\frac{2}{(I_C + 1)^T}\check{f}\check{f}^T + \lambda\check{g}\check{g}^T + \lambda(J - \alpha)\check{H}.$$

Both $\check{f}\check{f}^T$ and $\check{g}\check{g}^T$ are rank-one matrices, allowing the problem to be viewed as a rank-two update to the eigensystem for $\lambda(J-\alpha)\check{H}$. The problem may then be simplified using deflation, and it can be shown that both $\check{g}$ and $\check{f}$ are orthogonal to the six pseudo-cross-product eigenvectors of $\check{H}$. As a result, the eigenvectors of $\check{H}$ and corresponding eigenvalues remain unchanged, and the rank-two update is simplified to the effect solely on the depressed cubic (equations (32) and (38)). This system is sufficiently small that direct symbolic examination is tractable. The eigenvalues of the rank-two updated matrix are the roots of:

$$\overline{\in} + c_2 \overline{\in}^2 + c_1 \overline{\in} + c_0 = 0$$

$$c_2 = -\|\check{g}\|_2^2 \rho - I_C \eta$$

$$c_1 = -(1 + 2J\rho)I_C - 6J\eta + (\|\check{g}\|_2^2 I_C - 9J^2)\rho\eta$$

$$c_0 = -(2 + 3J\rho)J + (I_C^2 - 4\|\check{g}\|_2^2)\eta + 2J(I_C^2 - 3\|\check{g}\|_2^2)\rho\eta, \tag{41}$$

where $\eta$ and $\rho$ are defined as:

$$\eta = \frac{2\mu}{(I_C + 1)^2\left(\lambda(J - 1) - \frac{3}{4}\lambda\right)}, \rho = \frac{\lambda}{\lambda(J - 1) - \frac{3}{4}\mu}. \tag{42}$$

The cubic is no longer depressed, and the cubic formula may be used to obtain a closed-form expression, or alternatively the roots may be solved for using, e.g., the rpoly algorithm. The form of the eigenvectors remains the same, $$Q_k = \frac{1}{q_k} U D_k V^T,$$

but the diagonal entries differ, $$D_k = \begin{bmatrix} \alpha_0 & 0 & 0 \\ 0 & \alpha_1 & 0 \\ 0 & 0 & \alpha_2 \end{bmatrix}, \tag{43}$$

and instead take the form:

$$\alpha_0 = \overline{\in}_k(\sigma_1 + \sigma_0\sigma_2\eta + J\sigma_1\rho) + \sigma_0\sigma_2 + \sigma_1(\sigma_0^2 - \sigma_1^2 + \sigma_2^2)\eta + J\sigma_0\sigma_2\rho + \sigma_0(\sigma_0^2 - \sigma_1^2)\sigma_2(\sigma_1^2 - \sigma_2^2)\rho\eta$$

$$\alpha_1 = \overline{\in}_k(\sigma_0+\sigma_1\sigma_2\eta+J\sigma_0\rho)+\sigma_0\sigma_2-\sigma_0(\sigma_0^2-\sigma_1^2-\sigma_2^2)\eta+J\sigma_1\sigma_2\rho-\sigma_1(\sigma_0^2-\sigma_1^2)\sigma_2(\sigma_1^2-\sigma_2^2)\rho\eta$$

$$\alpha_2=\overline{\in}_k^2-\overline{\in}_k(\sigma_0^2+\sigma_1^2)(\eta+\sigma_2^2\rho)-\sigma_2^2-2J\eta-2J\sigma_2^2\rho+((\sigma_0^2-\sigma_1^2)\sigma_2)^2\rho\eta.$$

With these expressions for the rank-two updated system, the $$\mu_T = \mu\left(1 - \frac{1}{I_C+1}\right)$$

regularization term may be added to arrive at the final eigenvalues, the first three of which are $$\in_k = \lambda(J-\alpha)\overline{\in}_k + \mu_T \quad k=0\ldots 2, \tag{44}$$

where $\in_k$ are the roots of equation (41). The other six eigenvalues are:

$$\in_3=\lambda(J-\alpha)\sigma_0+\mu_T \quad \in_4=\lambda(J-\alpha)\sigma_1+\beta_T \tag{45}$$

$$\in_5=\lambda(J-\alpha)\sigma_2+\mu_T \quad \in_6=-\lambda(J-\alpha)\sigma_0+\mu_T \tag{46}$$

$$\in_7=-\lambda(J-\alpha)\sigma_1+\mu_T \quad \in_8=-\lambda(J-\alpha)\sigma_2+\mu_T. \tag{47}$$

The eigenanalysis discussed above is sufficiently general that it can be applied to any strain energy that employs the $I_C$ and $J$ strain invariants, such as extending the eigenanalysis to increased non-linearities in $I_C$. In general, consider a strain energy density expressed in terms of the $I_C$ and $J$ invariants that leads to a system of the form:

$$\check{A} = \lambda_I I + \lambda_F \check{f}\check{f}^T + \lambda_G \check{g}\check{g}^T + \lambda_H \check{H}. \tag{48}$$

The eigensystem can be obtained by setting $$\eta = \frac{\gamma_F}{\gamma_H} \text{ and } \rho = \frac{\gamma_G}{\gamma_H}$$

in equation (41), and $\mu_T=\gamma_I$ and $\lambda(J-\alpha)=\gamma_H$ in equations (44)-(47). For the particular exponential hardening of Fung-like models, which is a secondary feature of many biological tissues, a stabilized Fung model according to one embodiment is $$\Psi_{Fung} = \frac{\mu_0}{2}(I_C - 3) + \frac{\lambda}{2}(J - \alpha)^2 + \frac{\gamma}{2}\left(e^{\frac{\mu_1}{2}(I_C-3)} - 1\right). \tag{49}$$

Following the rest stabilization approach discussed above, the energy may be established by setting $$\alpha = 1 + \frac{\mu_0 + \gamma\mu_1}{\lambda}.$$

The PK1 then expands to:

$$P_{Fung}(F) = \mu_0 F + \lambda\frac{\partial J}{\partial F}(J - \alpha) + \gamma\mu_1 e^{\frac{\mu_1}{2}(I_C-3)}F. \tag{50}$$

The unfolded, assembled Hessian may then be written as:

$$\check{A}_{Fung} = \left(\mu_0 + \gamma\mu_1 e^{\frac{\mu_1}{2}(I_C-3)}\right)I + \lambda\check{g}\check{g}^T + \lambda(J-\alpha)\check{H} + 2\gamma\mu_1^2 e^{\frac{\mu_1}{2}(I_C-3)}\check{f}\check{f}^T. \tag{51}$$

The following constants change in the eigenanalysis:

$$\eta = \frac{2\gamma\mu_1^2 e^{\frac{\mu_1}{2}(I_C-3)}}{\lambda(J-\alpha)} \quad \rho = \frac{1}{J-\alpha} \quad \mu_T = \left(\mu_0 + \gamma\mu_1 e^{\frac{\mu_1}{2}(I_C-3)}\right). \tag{52}$$

The hardening term may also be represented with a polynomial using the Arruda-Boyce model:

$$\Psi_{AB} = \sum_{i=1}^{n} a_i(I_C^i - 3^i). \tag{53}$$

Using the three-term expansion for illustrative purposes and shifting the constants to maintain consistency with the Neo-Hookean parameters gives the following energy:

$$\Psi_{AB} = \frac{\mu}{2}(I_C - 3) + \frac{\mu\beta_1}{4}(I_C^2 - 9) + \frac{\mu\beta_2}{6}(I_C^3 - 27) + \frac{\lambda}{2}(J - \alpha)^2. \tag{54}$$

The energy of equation (54) is rest-stable when $$\alpha = 1 + \frac{\mu}{\lambda}(1 + 3\beta_1 + 9\beta_2),$$

leading to a PK1 of $$P_{AB}(F) = \mu(1 + \beta_1 I_C + \beta_2 I_C^2)F + \lambda\frac{\partial J}{\partial F}(J - \alpha) \tag{55}$$

and a Hessian of $$\check{A}_{AB} = \mu(1+\beta_1 I_C+\beta_2 I_C^2)I + \lambda\check{g}\check{g}^T + \lambda(J-\alpha)\check{H} + 2\mu(\beta_1+2\beta_2 I_C)\check{f}\check{f}^T. \tag{56}$$

Such a system leads to the following constants in the eigenanalysis:

$$\eta = \frac{2\mu(\beta_1 + 2\beta_2 I_C)}{\lambda(J-\alpha)} \quad \rho = \frac{1}{J-\alpha} \quad \mu_T = \mu(1 + \beta_1 I_C + \beta_2 I_C^2). \tag{57}$$

Rendering Stable Neo-Hookean Simulations

Figure 4:
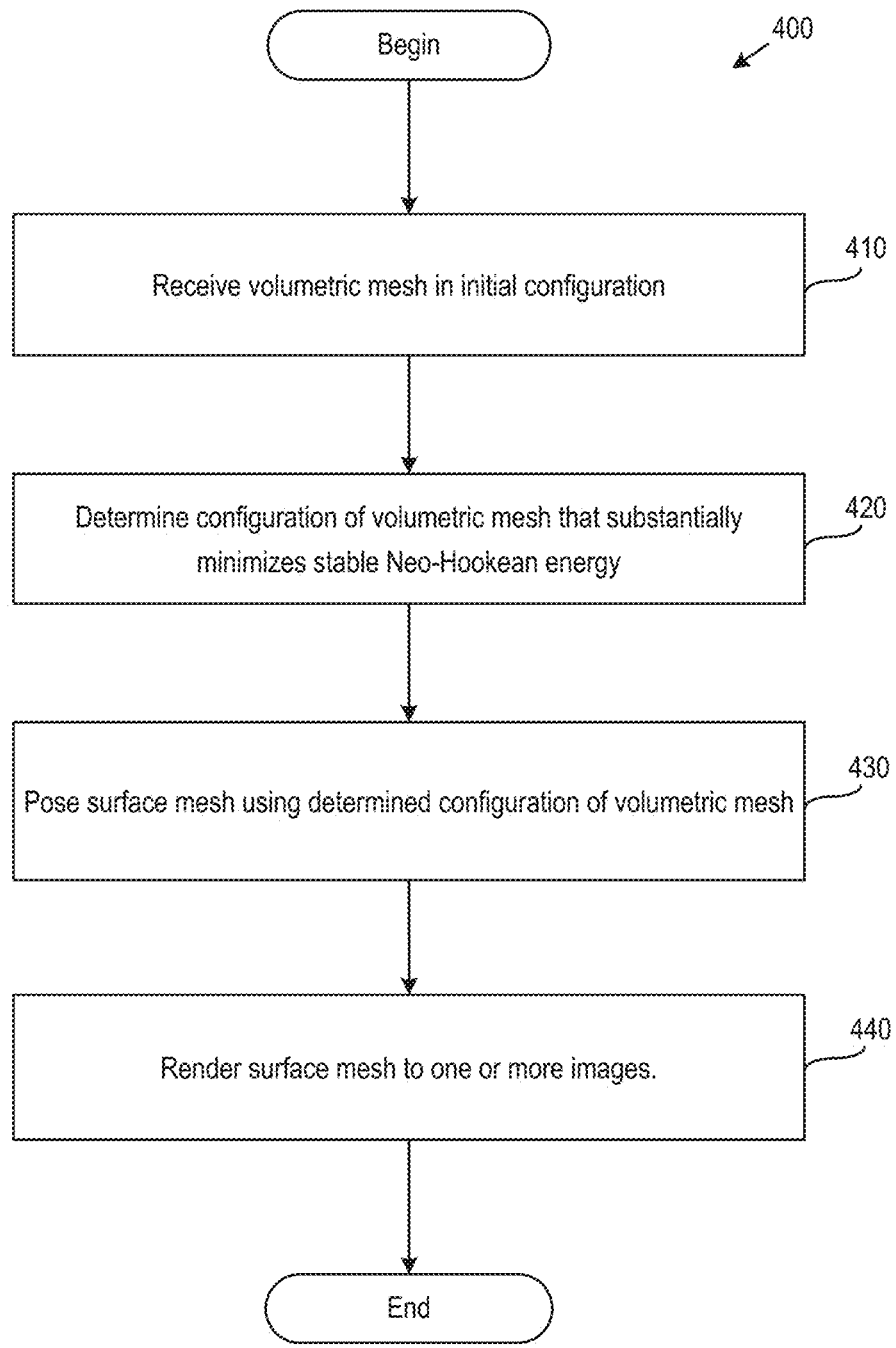
FIG. 4 illustrates a method for rendering images based on a simulation using a stable Neo-Hookean energy model, according to an embodiment.

As described, quasistatic simulations may be performed using the stable Neo-Hookean energy model, and the simulation results may then be rendered to produce image(s), such as the image frames of a video. FIG. 4 illustrates a method 400 for rendering images based on a simulation using the stable Neo-Hookean energy model, according to an embodiment. Although discussed with respect to the stable Neo-Hookean energy model, other embodiments may employ different energy models, such as the Fung-like models described above. As shown, the method 400 begins at step 410, where a simulation application receives a volumetric mesh in an initial configuration. Any suitable volumetric mesh, such as a hexahedral lattice mesh or a tetrahedral mesh, may be used, and the mesh may also be bound to a set of bones (also referred to as a skeleton or rig) used to animate the mesh.

At step 420, the simulation application determines a configuration of the volumetric mesh that substantially minimizes the stable Neo-Hookean energy. The substantially minimized energy may or may not be exactly zero. In one embodiment, the simulation application may employ a Newton solver to converge, via a number of Newton iterations, to the substantially minimized energy. In such a case, the simulation may, during each Newton iteration, determine first (gradient) and second (Hessian) derivatives of the stable Neo-Hookean energy as well as eigenvectors and eigenvalues of the Hessian, clamp negative eigenvalues to zero, solve for a correction vector, and perform a line search to determine if scaling the correction vector decreases the energy, as discussed in greater detail below with respect to FIG. 5. Any suitable techniques other than the Newton method may also be used to converge to the substantially minimized energy.

At step 430, the simulation application poses a surface mesh using the determined configuration of the volumetric mesh. For example, in the case of the hexahedral mesh shown in FIG. 3, the simulation application may determined a configuration of the hexahedral mesh that substantially minimizes the stable Neo-Hookean energy and use the determined configuration to drag along a surface mesh that is then rendered. As another example, a tetrahedral mesh may include volumetric mesh with triangles on the surface and vertices in the interior. In such a case, the simulation application may directly move the vertices based on the determined configuration that substantially minimizes the stable Neo-Hookean energy, and doing so displaces the surface triangles that may then be rendered.

At step 440, the simulation application renders the surface mesh to one or more images. It should be understood that the interior mesh (e.g., a hexahedral mesh) may be rendered as well, but such a rendering may also be omitted, as the interior mesh is typically not visible in rendered images. Although described with respect to the simulation application performing the rendering, in another embodiment the simulation application may send the posed surface mesh to a renderer application that performs the rendering.

In one embodiment, collisions may also be enabled the simulation and handled with a reference map-based penalty force. For example, starting from a surface point sampling, a special grid acceleration structure may be used to locate sample points in a tetrahedralization of a hexhadral mesh. If a sample point collides with a tetrahedron, then the sample is mapped to the reference domain, where the closest surface point is computed. The surface point and the original surface sample may then be mapped back to the deformation domain and define a penalty spring. Due to the two linear maps, such a target position is not always the closest point on the deformed surface mesh. If clean and conforming contacts are desired, an additional local optimization may be performed on the deformed surface mesh that iteratively searches for closer points, and this process typically converges in a single iteration.

Figure 5:
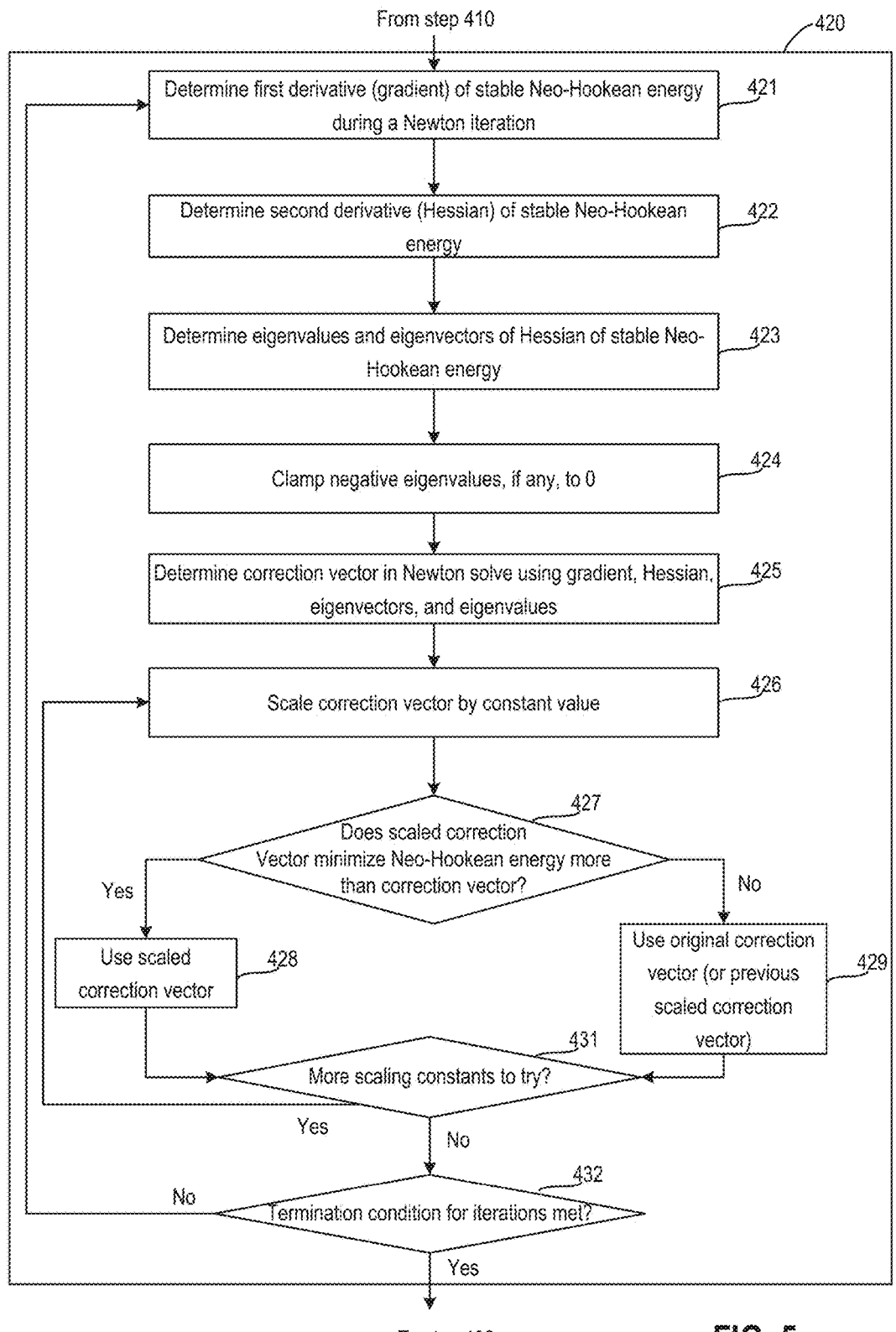
FIG. 5 illustrates in greater detail one of the steps of the method of FIG. 4, according to an embodiment.

FIG. 5 illustrates in greater detail step 420 of the method 400 using Newton iterations, according to an embodiment. As described, Newton iterations may be used to converge to a minimum of the stable Neo-Hookean energy. As shown, at step 421, the simulation application determines a first derivative (i.e., the gradient) of the stable Neo-Hookean energy during a Newton iteration. In one embodiment, the first derivative may be the first Piola-Kirchoff Stress (PK1) of equation (17), described above. The goal of the simulation is make the volumetric mesh's configuration obey the laws of physics, which requires determining where forces appear and minimizing the amount of force that appears to obtain the most natural configuration for the volumetric mesh. The places where forces appear may be determined using the first derivative of the stable Neo-Hookean energy (i.e., PK1).

At step 422, the simulation application further determines a second derivative (i.e., the Hessian) of the stable Neo-Hookean energy. In one embodiment, the Hessian may be determined using equation (19), described above. It should be understood that the PK1 stress of equation (17) is a vector and the Hessian of equation (19) is a matrix, and the simulation application may perform a Newton solve using such a vector and matrix to obtain, at each step of the Newton iteration, a (better) guess for the minimum energy configuration of the volumetric mesh representing the most naturalistic pose, as discussed in greater detail below. As the equations being solved are non-linear, several Newton iterations may be required before converging to a minimum, optimal energy configuration.

At step 423, the simulation application determines eigenvalues and eigenvectors of the Hessian of the stable Neo-Hookean energy. In one embodiment, during construction of the Hessian of equation (16), the simulation application may check the eigenvalues and eigenvectors of the Hessian to determine whether any eigenvalues are negative. Although described with respect to the stable Neo-Hookean energy, it should be understood that any other energy, such as the Fung-like models described above, may also be used if, e.g., the eigenanalysis above can be used to determine the eigenvectors and eigenvalues of such an energy.

At step 424, if any of the eigenvalues determined at step 423 are negative, the simulation application clamps such negative eigenvalues to 0. In particular, the eigenvalues may be computed using equations (44)-(47), and if the simulation application determines that any of the computed eigenvalues are negative, then the simulation application sets such negative eigenvalues to zero instead. Geometrically, positive eigenvalues are associated with a "bowl" configuration of energy values, on which Newton iteration guesses may lie, and getting to the bottom of such a "bowl" minimizes the energy. By contrast, negative eigenvalues may be associated with a "saddle" configuration of energy values that can explode to infinity in different directions.

At step 425, the simulation application uses the gradient, Hessian, eigenvectors, and eigenvalues (including the eigenvalues set to zero) in a Newton solve to determine a correction vector. The Newton solve may include solving a linear system that includes a force given by equation (18) on one side of the linear system and a matrix given by equation (2) on another side of the linear system. Such a linear system may be solved in any suitable manner, including using a conjugate gradient implementation.

At step 426, the simulation application scales (i.e, multiplies) the correction vector by a constant value. Then, at step 427, the simulation application determines whether the scaled correction vector minimizes the stable Neo-Hookean energy more than the correction vector itself and previous scaled correction vectors, if any. That is, the simulation application performs a line search to determine whether the correction vector produced by the Newton solve at step 425 can be improved upon to produce a more naturalistic pose that minimizes the stable Neo-Hookean energy more.

If the simulation application determines that the scaled correction vector minimizes the stable Neo-Hookean energy more than the correction vector and previous scaled correction vectors (if any), then the simulation application uses the scaled correction vector as the guess of the most naturalistic pose for the current iteration at step 428. On the other hand, if the simulation application determines that the scaled correction vector does not minimize the stable Neo-Hookean energy more than the correction vector or previous scaled correction vectors (if any), then the simulation application keeps the correction vector or a previous scaled correction vector (if the previous scaled correction vector minimizes the stable Neo-Hookean energy more than the correction vector itself) as the guess for the current iteration at step 429.

At step 431, if there are more scaling constants to try (e.g., the simulation application may try a predefined number of different scaling constants), then the method 400 returns to step 426, where the simulation application scales the correction vector by another constant value. Otherwise, the method 400 continues to step 432, where the simulation application determines whether a termination condition of the Newton iterations has been met. The termination condition may either be that a (user-defined) maximum number of Newton iterations has been reached, or the magnitude of a "residual" vector becomes sufficiently small, such as below a predefined threshold. The "residual" vector is the right hand side of the linear systems being solved. That is, when the termination condition is met, the forces that remain to be corrected are sufficiently small and close to zero to stop the Newton iterations.

If the termination condition has not been met, then another Newton iteration is performed by returning to step 421, where the simulation application determines another first derivative of the stable Neo-Hookean energy (and another second derivate of the stable Neo-Hookean energy, etc.).

Figure 6:
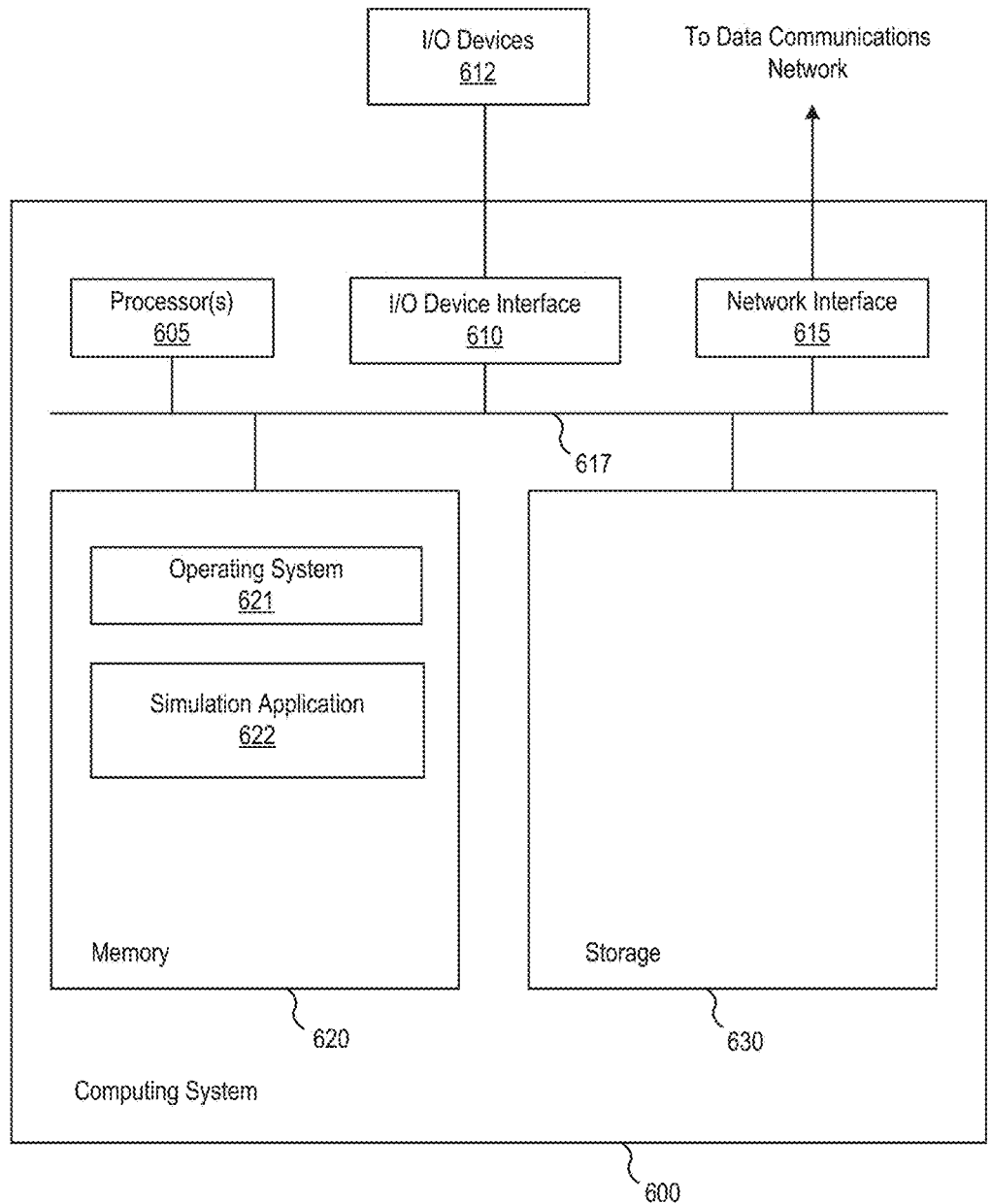
FIG. 6 illustrates a system in which an embodiment may be implemented.

FIG. 6 illustrates a system in which an embodiment may be implemented. As shown, the system 600 includes, without limitation, a central processing unit (CPU) 605, a network interface 615 connecting the system to a network 616, an interconnect 617, a memory 620, and storage 630. The system 600 may also include an I/O device interface 610 connecting I/O devices 612 (e.g., keyboard, display and mouse devices) to the system 600.

The CPU 605 retrieves and executes programming instructions stored in the memory 620. Similarly, the CPU 605 stores and retrieves application data residing in the memory 620. The interconnect 617 facilitates transmission, such as of programming instructions and application data, between the CPU 605, I/O device interface 610, storage 630, network interface 615, and memory 620. CPU 605 is included to be representative of a single CPU, multiple CPUs, a single CPU having multiple processing cores, and the like. And the memory 620 is generally included to be representative of a random access memory. The storage 630 may be a disk drive storage device. Although shown as a single unit, the storage 630 may be a combination of fixed and/or removable storage devices, such as magnetic disk drives, flash drives, removable memory cards or optical storage, network attached storage (NAS), or a storage area-network (SAN). Further, system 600 is included to be representative of a physical computing system as well as virtual machine instances hosted on a set of underlying physical computing systems. Further still, although shown as a single computing system, one of ordinary skill in the art will recognized that the components of the system 600 shown in FIG. 6 may be distributed across multiple computing systems connected by a data communications network.

As shown, the memory 620 includes an operating system 621 and a simulation application 622. Illustratively, the operating system 621 may include Linux®. The simulation application 622 is configured to simulate and render materials such as flesh to one or more images, such as the image frames of a video. In one embodiment, the simulation application 622 may receive a volumetric mesh, determine a configuration of the volumetric mesh that substantially minimizes a stable Neo-Hookean energy, pose a surface mesh using the determined configuration, and render the surface mesh to one or more images, according to the method 400 described above with respect to FIG. 4. Determining the configuration of the volumetric mesh that substantially minimizes the stable Neo-Hookean energy may include performing one or more iterations in which the simulation application determines first (i.e., the gradient) and second (i.e., the Hessian) derivatives of the stable Neo-Hookean energy; determines eigenvalues and eigenvectors of the Hessian of the stable Neo-Hookean energy; clamps negative eigenvalues, if any, to 0; uses the gradient, Hessian, eigenvectors, and eigenvalues (including the eigenvalues set to zero) in a Newton solve to determine a correction vector; and performs a line search to attempt to improve correction vector produced by the Newton solve, as described above with respect to FIG. 5.

Although described herein primarily with respect to a stable Neo-Hookean energy with a regularized origin barrier term, if a fleshy material with Poisson's ratio ν≥0.4 is being simulated, then the regularized origin barrier may be discarded in one embodiment. The Hessian becomes $$\tilde{A}=\mu I+\lambda\tilde{g}\tilde{g}^T+\lambda(J-\alpha)\tilde{H}, \tag{58}$$

which is only a rank-one updated system. The deflation argument discussed above still applies, and the rank-one updated cubic is instead $$\overline{\epsilon}^{-3}-\rho\|\tilde{g}\|_2^2\overline{\epsilon}^{-3}-(1+2\rho J)\|F\|_F^2\overline{\epsilon}-(2+3\rho J)J=0, \tag{59}$$

where $\rho=(J-\alpha)^{-1}$. The diagonal entries in the eigenvector $$Q_k = \frac{1}{q_k} U D_k V^T$$

may be written as:

$$D_k = \begin{bmatrix} \alpha(\sigma_0\sigma_2 + \sigma_1\overline{\epsilon}_k) & 0 & 0 \\ 0 & \alpha(\sigma_1\sigma_2 + \sigma_0\overline{\epsilon}_k) & 0 \\ 0 & 0 & \overline{\epsilon}_k^2 - \beta\sigma_2^2 \end{bmatrix} \tag{60}$$

$$\alpha = 1 + \rho J$$

$$\beta = \alpha + \rho(J + (\sigma_0^2 + \sigma_1^2)\overline{\epsilon}_i).$$

Advantageously, techniques disclosed herein provide a stable Neo-Hookean energy model that does not include any logarithm terms with singularities or require the use of arbitrarily selected clamping parameters. Further, the stable Neo-Hookean energy has the properties of inversion, reflection, and rest stability. As a result, the stable Neo-Hookean energy may be used in the simulation and rendering of materials such as flesh that require volume preservation, the stable Neo-Hookean energy can remain stable under large deformations including inversions, and the stable Neo-Hookean energy tends to produce more realistic results than other elastic energy models such as the commonly used co-rotational model. In addition, closed-form expressions for the eigendecomposition of the components of the stable Neo-Hookean energy are disclosed, with the sum of such components possessing a special structure that allows the eigensystem to be written as simple expressions. Such closed-form expressions of eigenvalues and eigenvectors of a Hessian of the stable Neo-Hookean energy (as well as other energies) may be used to, e.g., project the Hessian to semi-positive-definiteness in simulations using Newton-based implicit schemes that use conjugate gradient solvers.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A computer-implemented method for rendering one or more images depicting a material, comprising:
 receiving a volumetric mesh in an initial configuration;
 determining a configuration of the volumetric mesh which substantially minimizes an energy model characterizing deformation of the volumetric mesh, wherein the energy model includes a length-preserving term, one or more volume-preserving terms, and an origin barrier term, and wherein the volume-preserving terms do not include singularities;
 posing a surface mesh based, at least in part, on the determined configuration of the volumetric mesh; and
 rendering one or more images using at least the posed surface mesh.

2. The method of claim 1, wherein the volume-preserving terms of the energy model include one or more terms from a Taylor expansion of a logarithm of a measurement of volume.

3. The method of claim 1, wherein at least one of the volume-preserving terms of the energy model has a root shifted from 1.

4. The method of claim 3, wherein the origin barrier term increases a difficulty of collapsing the volumetric mesh to a point and expands the volumetric mesh in response to a perturbation when the volumetric mesh is collapsed to a point.

5. The method of claim 4, wherein the energy model has form $$\Psi = \frac{\mu}{2}(I_C - 3) + \frac{\lambda}{2}(J - \alpha)^2 + \frac{\mu}{2}\log(I_C + 1),$$

where $$\alpha = 1 + \mu/\lambda - \left(\frac{\mu}{4}\right)\lambda$$

is a shifted rest-stability term, $\Psi$ is a hyperelastic energy density, $\mu$ and $\lambda$ are Lamé constants, J is a measurement of a volume of the volumetric mesh, and $I_C$ represents a length that a spring is extended.

6. The method of claim 1, wherein the determining the configuration of the volumetric mesh which substantially minimizes the energy model includes, for each of a plurality of iterations:
 determining a first derivative of the energy model;
 determining a second derivative of the energy model;
 determining eigenvalues and eigenvectors of the second derivative of the energy model;
 when the determined eigenvalues are negative, setting the negative eigenvalues to zero; and
 determining a guess of a configuration of the volumetric mesh which substantially minimizes the energy model using the first and second derivatives of the energy model, the eigenvectors, and the eigenvalues.

7. The method of claim 6, wherein the eigenvalues and eigenvectors are closed form expressions.

8. The method of claim 6, wherein each of the plurality of iterations further includes, performing a line search using the guess of the configuration of the volumetric mesh.

9. The method of claim 6, wherein the energy model is one of a stable Neo-Hookean energy model and a Fung-like energy model.

10. The method of claim 1, wherein the volumetric mesh represents human flesh.

11. A non-transitory computer-readable storage medium storing a program, which, when executed by a processor performs operations for rendering one or more images depicting a material, the operations comprising:
 receiving a volumetric mesh in an initial configuration;
 determining a configuration of the volumetric mesh which substantially minimizes an energy model characterizing deformation of the volumetric mesh, wherein the energy model includes a length-preserving term, one or more volume-preserving terms, and an origin barrier term, and wherein the volume-preserving terms do not include singularities;
 posing a surface mesh based, at least in part, on the determined configuration of the volumetric mesh; and
 rendering one or more images using at least the posed surface mesh.

12. The computer-readable storage medium of claim 11, wherein the volume-preserving terms of the energy model include one or more terms from a Taylor expansion of a logarithm of a measurement of volume.

13. The computer-readable storage medium of claim 12, wherein at least one of the volume-preserving terms of the energy model has a root shifted from 1.

14. The computer-readable storage medium of claim 13, wherein the origin barrier term increases a difficulty of collapsing the volumetric mesh to a point and expands the volumetric mesh in response to a perturbation when the volumetric mesh is collapsed to a point.

15. The computer-readable storage medium of claim 14, wherein the energy model has form $$\Psi = \frac{\mu}{2}(I_C - 3) + \frac{\lambda}{2}(J - \alpha)^2 + \frac{\mu}{2}\log(I_C + 1),$$

where $$\alpha = 1 + \mu/\lambda - \left(\frac{\mu}{4}\right)\lambda$$

is a shifted rest-stability term, $\Psi$ is a hyperelastic energy density, $\mu$ and $\lambda$ are Lamé constants, J is a measurement of a volume of the volumetric mesh, and $I_C$ represents a length that a spring is extended.

16. The computer-readable storage medium of claim 11, wherein the determining the configuration of the volumetric mesh which substantially minimizes the energy model includes, for each of a plurality of iterations:
   determining a first derivative of the energy model;
   determining a second derivative of the energy model;
   determining eigenvalues and eigenvectors of the second derivative of the energy model;
   when the determined eigenvalues are negative, setting the negative eigenvalues to zero; and
   determining a guess of a configuration of the volumetric mesh which substantially minimizes the energy model using the first and second derivatives of the energy model, the eigenvectors, and the eigenvalues.

17. The computer-readable storage medium of claim 16, wherein the eigenvalues and eigenvectors are closed form expressions.

18. The computer-readable storage medium of claim 16, wherein each of the plurality of iterations further includes, performing a line search using the guess of the configuration of the volumetric mesh.

19. The computer-readable storage medium of claim 16, wherein the energy model is one of a stable Neo-Hookean energy model and a Fung-like energy model.

20. A system, comprising:
   a processor; and
   a memory, wherein the memory includes an application program configured to perform operations for rendering one or more images depicting a material, the operations comprising:
      receiving a volumetric mesh in an initial configuration,
      determining a configuration of the volumetric mesh which substantially minimizes an energy model characterizing deformation of the volumetric mesh, wherein the energy model includes a length-preserving term, one or more volume-preserving terms, and an origin barrier term, and wherein the volume-preserving terms do not include singularities,
      posing a surface mesh based, at least in part, on the determined configuration of the volumetric mesh, and
      rendering one or more images using at least the posed surface mesh.

* * * * *

UNITED STATES PATENT AND TRADEMARK OFFICE
CERTIFICATE OF CORRECTION

PATENT NO. : 10,366,184 B1
APPLICATION NO. : 15/941928
DATED : July 30, 2019
INVENTOR(S) : Theodore W. Kim et al.

It is certified that error appears in the above-identified patent and that said Letters Patent is hereby corrected as shown below:

In the Specification

In Column 2, Line 34, delete "$\mu \in [$" and insert -- $v \in [$ --, therefor.
In Column 6, Line 40, delete "Piola-Kirchoff" and insert -- Piola-Kirchhoff --, therefor.
In Column 11, Line 20, delete "Venant-Kirchoff" and insert -- Venant-Kirchhoff --, therefor.
In Column 16, Line 11, delete "Tikihonov" and insert -- Tikhonov --, therefor.
In Column 21, Lines 30-31, delete "eigenanalsysis" and insert -- eigenanalysis --, therefor.
In Column 23, Line 50, delete "hexhadral" and insert -- hexahedral --, therefor.
In Column 24, Line 2, delete "Piola-Kirchoff" and insert -- Piola-Kirchhoff --, therefor.

Signed and Sealed this
Nineteenth Day of November, 2019

Andrei Iancu
*Director of the United States Patent and Trademark Office*